(12) United States Patent
Justiniano et al.

(10) Patent No.: US 6,201,709 B1
(45) Date of Patent: Mar. 13, 2001

(54) MOUNTING SYSTEM TO SUPPORT ELECTRICAL COMPONENTS IN A STACKED RELATIONSHIP TO ONE ANOTHER

(75) Inventors: Joseph G. Justiniano, Centereach, NY (US); Danilo F. Estanislao, Old Bridge, NJ (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

(21) Appl. No.: 09/263,915

(22) Filed: Mar. 5, 1999

(51) Int. Cl.[7] ................................................. H05K 7/02
(52) U.S. Cl. .................. 361/790; 361/784; 361/785; 361/752; 361/748; 439/76.1; 439/76.2; 439/483; 174/52.1; 174/255; 174/260
(58) Field of Search ..................... 361/790, 784, 361/785, 752, 748, 756, 759, 760, 765, 807; 439/76.1, 76.2, 483; 174/52.1, 52.4, 250, 255, 260; 257/685, 686, 690, 698

(56) References Cited

U.S. PATENT DOCUMENTS

| | | | |
|---|---|---|---|
| 4,218,724 | * 8/1980 | Kaufman | 361/736 |
| 4,226,491 | * 10/1980 | Kazama et al. | 439/76.1 |
| 5,067,905 | * 11/1991 | Matsumoto et al. | 439/76.1 |
| 5,575,686 | * 11/1996 | Noschese | 439/620 |
| 5,644,277 | * 7/1997 | Gulick et al. | 333/246 |
| 5,793,998 | * 8/1998 | Copeland et al. | 395/309 |
| 5,822,194 | * 10/1998 | Horiba et al. | 361/760 |
| 5,825,633 | * 10/1998 | Bujalski et al. | 361/804 |
| 5,935,687 | * 8/1999 | Davidson et al. | 428/195 |

* cited by examiner

Primary Examiner—Jeffrey Gaffin
Assistant Examiner—David Foster
(74) Attorney, Agent, or Firm—Paul J. Sutton, Esq.

(57) ABSTRACT

A mounting system using a mounting frame permits the support of up to three printed circuit boards in a stacked fashion. Various cut-outs provide ridge segments to support printed circuit boards at a top, bottom and intermediate plane. Locking devices adjacent selected ridge segments engage the printed circuit boards and hold them in assembly with the mounting frame. The individual printed circuit boards can be coupled to each other employing straight pin headers or employing flexible, flat ribbon cable connected to the printed circuit board traces by suitable connectors.

8 Claims, 5 Drawing Sheets

MOUNTING SYSTEM TO SUPPORT ELECTRICAL COMPONENTS IN A STACKED RELATIONSHIP TO ONE ANOTHER

BACKGROUND OF THE INVENTION

1. Field of the Invention

The invention is directed to the assembly of electrical components and more particularly to a mounting system to support electrical components in a stacked relationship to one another using a mounting frame.

2. Description of the Prior Art

At present when it is desired to mount a number of printed circuit boards in a stacked relationship to one another, it is necessary to use insulated stand-offs coupled between and to each of the printed circuit boards. The board's stand-offs must be positioned so as not to interfere with the circuits of the printed circuit boards or components on the printed circuit boards. The two printed circuit boards must be coordinated so that the stand-offs or other mounting hardware is properly positioned thereby limiting the interchangeability of the printed circuit boards. The use of stand-offs or other mounting hardware generally increases the size of the printed circuit boards. Also, such stacking approaches are generally limited to two printed circuit boards.

SUMMARY OF THE INVENTION

The invention is directed to a mounting system to support a plurality of electrical components in stacked relationship to one another. The mounting system makes use of a frame which establishes three parallel planes, a top plane, a bottom plane and an intermediate plane there between. The planes are delineated by a series of ridges and spaces at each of the three plane levels. Locking devices at each plane level holds a printed circuit board (PCB) in position at each plane. The frame and locking devices are integral and made of insulating material. Interconnection between the PCBs can be made by the use of straight pin headers or flexible, flat, ribbon cable. Various combinations of PCBs can be used with the same frame. Fewer than all three planes can also be used as necessary. It is an object of this invention to provide a novel mounting system.

It is an object of this invention to provide a novel mounting system to support a plurality of electrical components in stacked relationship to one another.

It is another object of this invention to provide a novel mounting frame on which and to which a plurality of PCBs can be mounted.

It is still another object of this invention to provide a novel mounting frame which includes locking devices at each plane to retain PCBs at the proper frame plane.

It is yet another object of this invention to provide a novel mounting system which does not require the use of stand-offs or other mounting hardware between the PCBs in the stack.

Other objects and features of the invention will be pointed out in the following description and claims and illustrated in the accompanying drawings, which disclose, by way of example, the principles of the invention, and the best mode which is presently contemplated for carrying them out.

BRIEF DESCRIPTION OF THE DRAWING

In the drawings in which similar elements are given similar reference characters.

DESCRIPTION OF THE PREFERRED EMBODIMENTS

Figure 1:
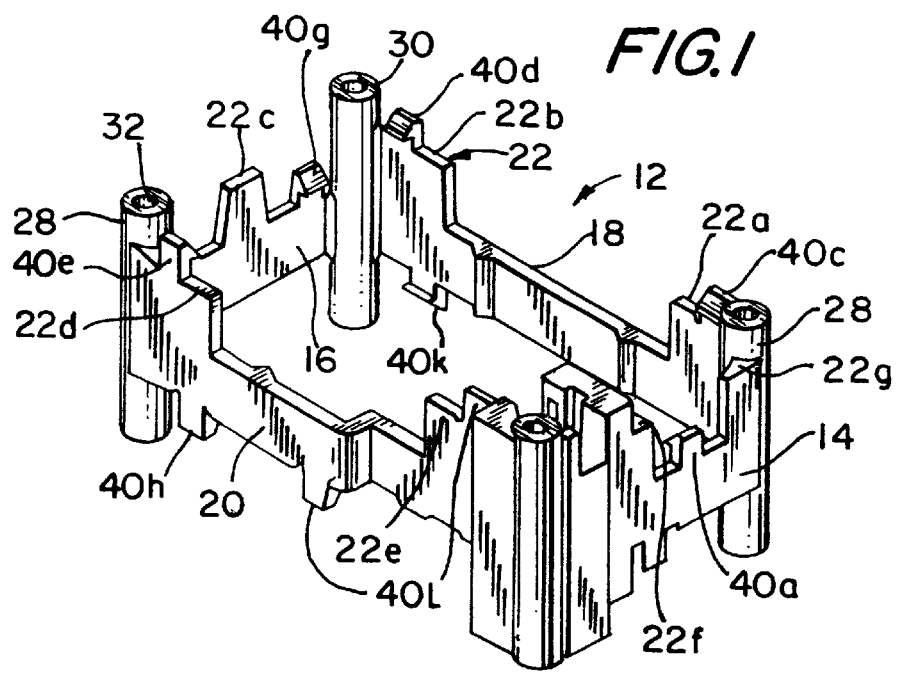
FIG. 1 is a top, left perspective view of a mounting frame according to the concepts of the invention.
Figure 2:
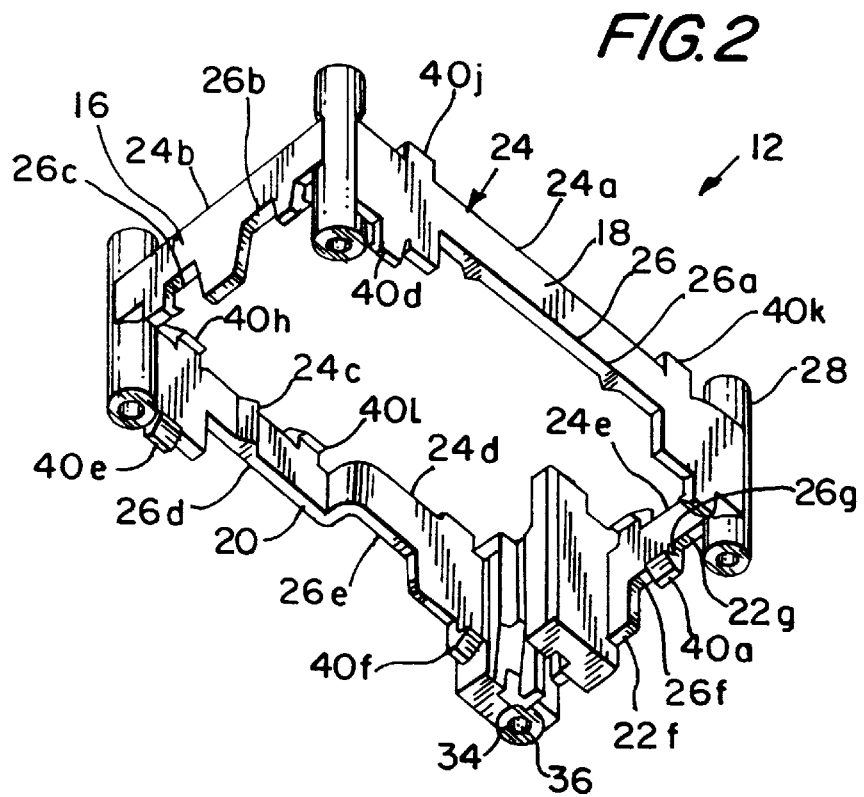
FIG. 2 is a bottom, right perspective view of the mounting frame of FIG. 1, rotated 180° about its longitudinal axis and 90° about its transverse axis.
Figure 4:
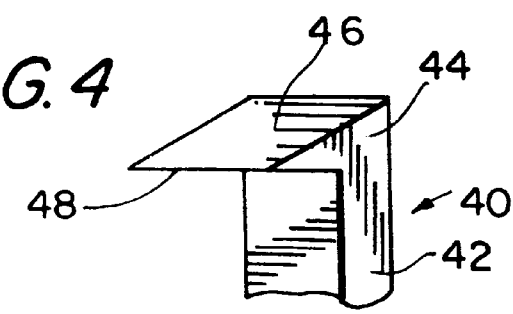
FIG. 4 is a fragmentary top right perspective view of a locking device of the mounting frame of FIG. 1.
Figure 7:
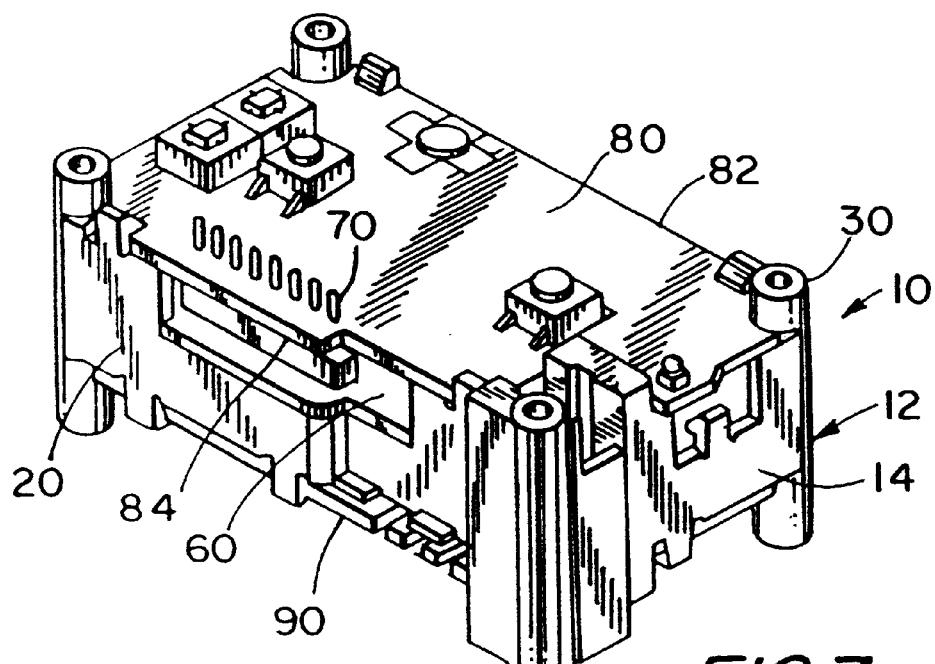
FIG. 7 is a top, left perspective view of the assembled mounting frame and the top, intermediate and bottom plane PCBs of FIG. 6.
Figure 8:
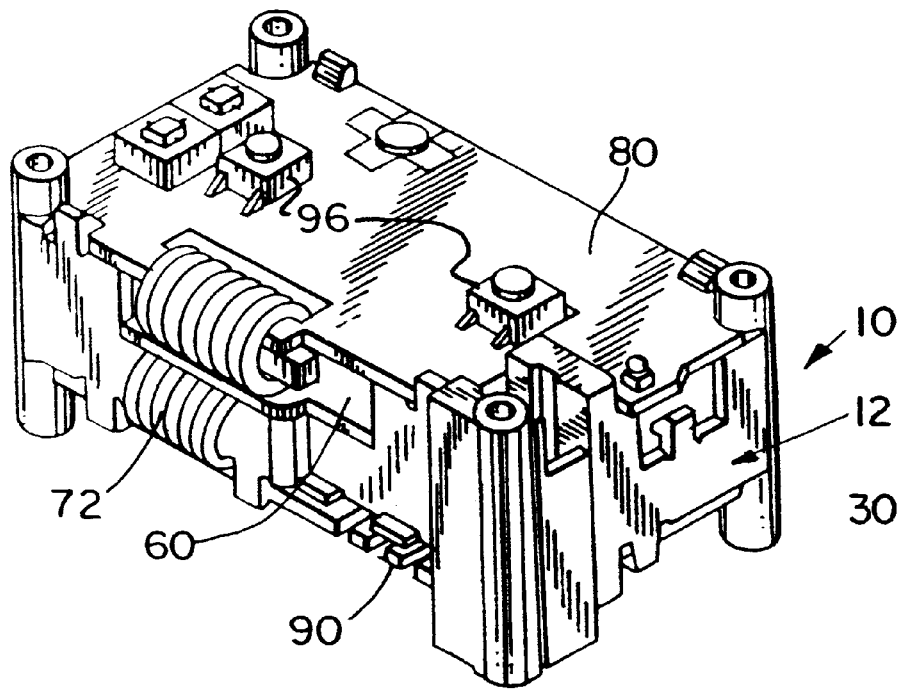
FIG. 8 is a top, left perspective view of the assembly of FIG. 7 with the individual PCBs completed together with flexible, flat ribbon cable.

Turning now to FIGS. 1, 2 and 4 there is shown a mounting frame 12 for a mounting system 10, designated only in FIGS. 7 and 8 constructed in accordance with the concepts of the invention. The mounting frame 12 has a first end portion 14, a second end portion 16 and a pair of spaced apart, generally parallel sides 18, 20. A first ridge 22, made up a plurality of ridge segments 22a, 22b, 22c, 22d, 22e, 22f and 22g define a top plane upon which can rest a PCB. A second ridge 24, made up a plurality of ridge segments 24a, 24b, 24c, 24d and 24e defines a bottom plane upon which can rest a PCB. A third ridge 26, made up a plurality of ridge segments 26a, 26b, 26c, 26d, 26e, 26f and 26g defines an intermediate plane upon which can rest a PCB. At each corner of the box made up of the first end portion 14, the second end portion 16 and sides 18, 20, there is a mounting column 28 which have an aperture 32 extending through a first end surface 30 and an aperture 36 extending through a second end surface 34. By use of the apertures 32, 36 the mounting frame 12 can be attached to a support surface or to another mounting frame 12.

Locking devices 40, namely 40c, 40d, 40e and 40i are provided at ridge segments 22a, 22b, 22d and 22e, respectively, to grip the top surface of a PCB after it has been placed upon the designated ridge segments 22. As best seen in FIG. 4 the locking device 40 has a flexible shaft 42 formed as a part of a ridge segment such as 22b and extending away from said segment 22b with a head 44 at the free end of the flexible shaft 42. The front face 46 of head 44 is outwardly tapered to deflect the locking device 40 outwardly as a PCB is moved into position on mounting frame 12. The under surface 48 of head 44 is generally perpendicular to the flexible shaft 42, and as stated above, comes to rest on the PCB once it is in place at its proper plane. Once the PCB has passed the front face 46 of the head 44, the flexible shaft 42 returns the head 44 to its original position due to the resilience of the material from which mounting frame 12 is made. The mounting frame 12 may be made from natural or synthetic rubber, thermoset or thermoplastic plastics or the like.

Figure 3:
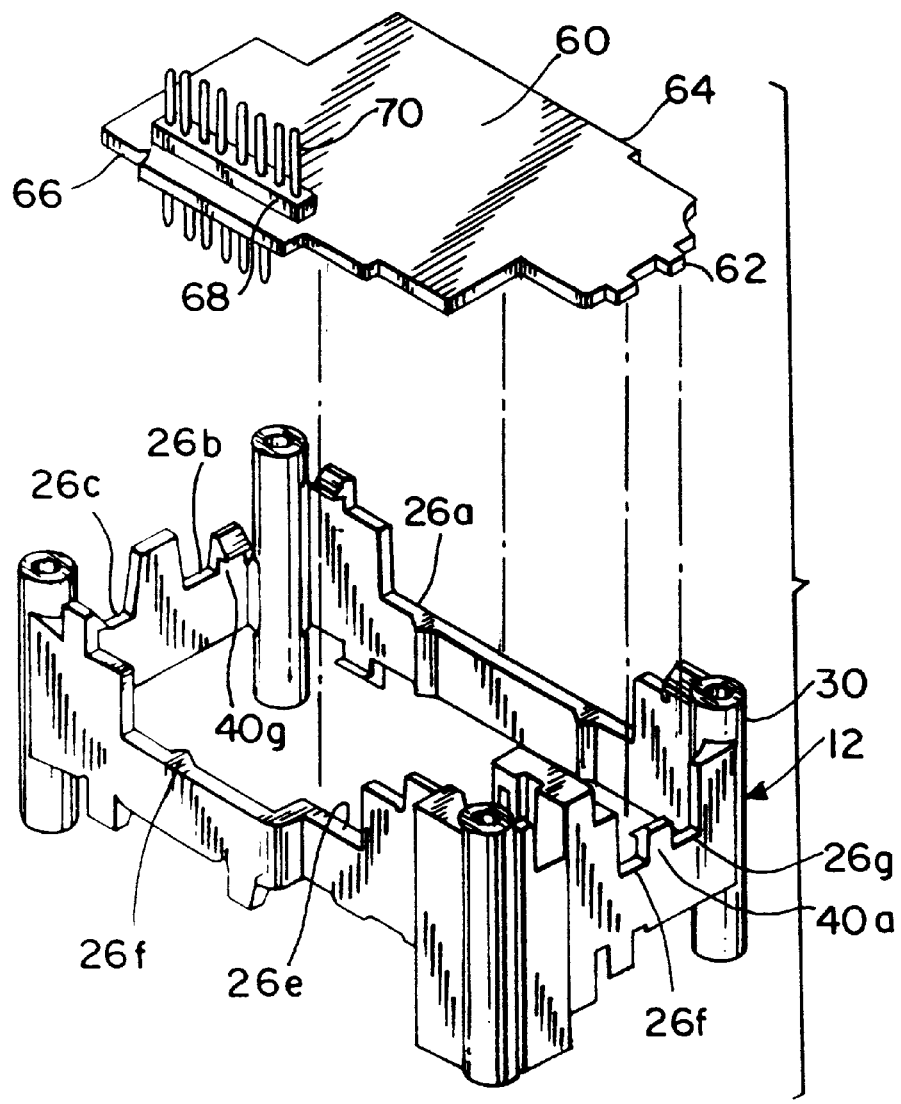
FIG. 3 is an exploded top, left perspective view of the mounting frame of FIG. 1 and an intermediate plane PCB.
Figure 5:
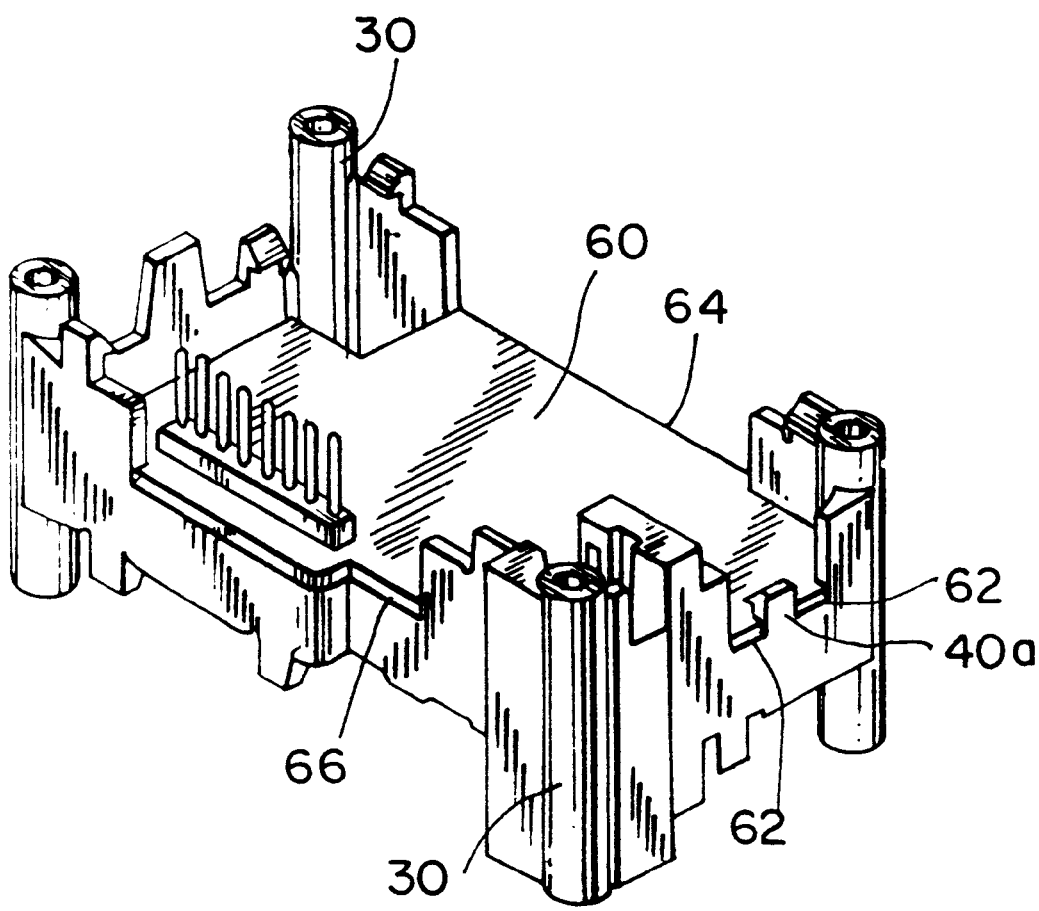
FIG. 5 is a top, left perspective view of the assembled mounting frame and intermediate plane PCB of FIG. 3.

Turning now to FIGS. 3 and 5 the installation of a PCB 60 to a mounting frame 12 at the intermediate plane is shown. The PCB 60 has two tongues 62 which will rest on ridge segments 26f and 26g and a marginal edge 64 which will rest on ridge segment 26a and a marginal edge 66 which will rest on ridge segments 26d and 26e. A locking device 40a will hold the PCB 60 in place. Locking device 40g can engage a thicker PCB but is not used with the thin PCB illustrated in FIG. 5. An eight position straight pin header 68 is mounted close to edge 66. The eight pins 70 of the header 68 extend above and below the PCB 60 for interconnection to the PCBs at the top plane and bottom plane. The pins 70 are soldered in place and join traces (not shown) on the adjacent PCBs to interconnect the circuits of these boards. Alternatively, as shown in FIG. 8, the PCBs may be interconnected by means of flat ribbon cable 72 using suitable connectors 96 on each PCB 60, 80 and 90.

Figure 6:
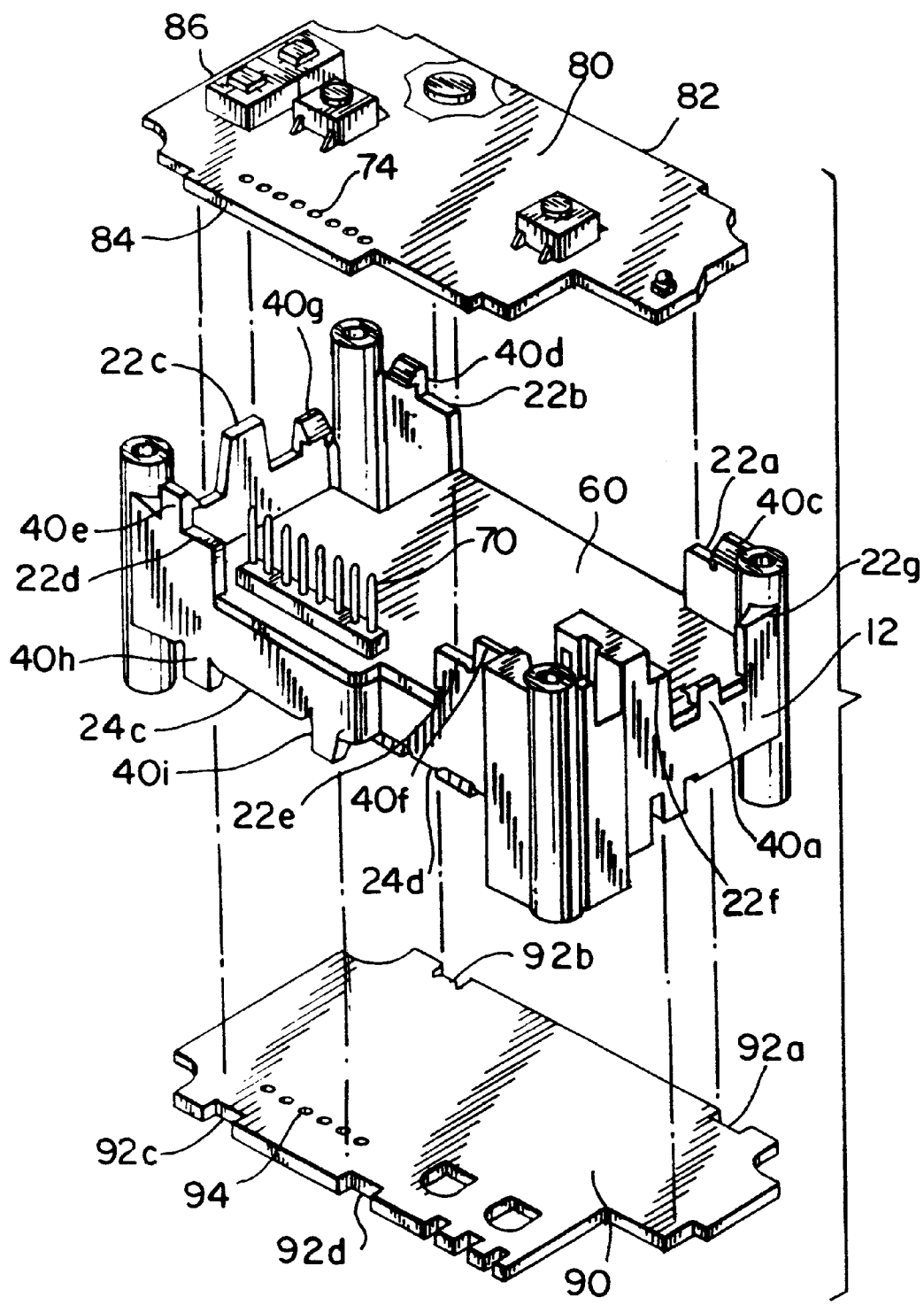
FIG. 6 is an exploded, top left perspective view of the assembly of FIG. 5 and showing PCBs to be assembled to the top and bottom planes of the mounting frame of FIG. 1.

Referring now to FIGS. 6 and 7 there are shown the subassembly of PCB 60 with mounting frame 12 and the top plane PCB 80 and bottom plane PCB 90. Portions of the marginal edge 82 engages the ridge segments 22a, 22b, while end edge 86 engages ridge segment 22c and marginal edge 84 engages ridge segments 22d and 22e. The locking devices 40c, 40d, 40e and 40f engage the PCB 80 to maintain it at the top plane of the mounting frame 12. The pins 70 extend through associated apertures 74 in the PCB 80 and can be joined to the traces (not shown) on the surface of the PCB 80 to connect the circuits on PCBs 60 and 80.

PCB 90 is placed on the mounting fame 12 at the bottom plane and rests on ridge segments 24a, 24b, 24c, 24d and 24e. Locking devices 40h and 40i engage the back walls defining the notches 92c and 92d. The notches 92a and 92b will be engaged by locking devices 40j and 40k (see FIG. 2). The pins 70 extend through apertures 94 in PCB 90 and can be soldered to the traces (not shown) on PCB 90.

While these have been shown and described and pointed out the fundamental novel features of the invention as applied to the preferred embodiments, as is presently contemplated for carrying them out, it will be understood that various omissions and substitutions and changes of the form and details of the devices illustrated and in its operation may be made by those skilled in the art, without departing from the spirit of the invention.

We claim:

1. A mounting system to support a plurality of electrical components in stacked relationship to one another comprising:

a) a frame having a first end portion and a second end portion and a pair of spaced apart, generally parallel sides so coupled to said first end portion and said second end portion to form a closed box with an open top portion and an open bottom portion;

b) said frame having a first plurality of ridges defining a top plane, a second plurality of ridges defining a bottom plane and a third plurality of ridges defining an intermediate plane between said top and bottom planes;

c) a first electrical component adapted to be mounted on said frame at said top plane;

d) a second electrical component adapted to be mounted on said frame at said bottom plane;

e) a third electrical component adapted to be mounted on said frame at said intermediate plane; and f) at least one locking device adjacent each of said top, bottom and intermediate planes to retain thereat associated ones of said first, second and third electrical components, wherein said at least two of said first, second and third printed circuit boards are coupled together by flat, ribbon cable.

2. A mounting system, as defined in claim 1, wherein said first, second and third printed circuit boards are coupled together by flat, ribbon cable.

3. A mounting system as defined in claim 1, wherein each of said at least one locking device further comprises:

a) a flexible shaft coupled to a selected one of said first, second or third ridges;

b) a head coupled to a free end of said flexible shaft, said head having an outwardly tapered surface to be engaged by an electrical component to outwardly deflect said head and a flat surface to engage an electrical component top surface after said electrical component passes said outwardly tapered surface.

4. A mounting system, as defined in claim 1, wherein said first electrical component has first cut-outs and first tabs to engage selected ones of said first plurality of ridges.

5. A mounting system, as defined in claim 1, wherein said second electrical component has second cut-outs and second tabs to engage selected ones of said second plurality of ridges.

6. A mounting system, as defined in claim 1, wherein said third electrical component has third cut-outs and third tabs to engage selected ones of said third plurality of ridges.

7. A mounting system, as defined in claim 1, wherein:

a) said first printed circuit board has first cut-outs and first tabs to engage selected ones of said first plurality of ridges;

b) said second printed circuit board has second cut-outs and second tabs to engage selected ones of said second plurality of ridges; and c) said third printed circuit board has third cut-outs and third tabs to engage selected ones of said third plurality of ridges.

8. A mounting system, as defined in claim 1, further comprising:

a) a mounting column at each of the four corners of said box, each mounting column having a first end surface and a second end surface; and b) two apertures for each of said mounting columns, one extending through said first end surface of said mounting column and a second one extending through said second end surface of said mounting column whereby said frame can be mounted to a support surface.

* * * * *